United States Patent
Feichtinger

(10) Patent No.: US 10,667,400 B2
(45) Date of Patent: May 26, 2020

(54) ELECTRICAL COMPONENT, COMPONENT ARRANGEMENT, AND A METHOD FOR PRODUCING AN ELECTRICAL COMPONENT AND COMPONENT ARRANGEMENT

(71) Applicant: EPCOS AG, Munich (DE)

(72) Inventor: Thomas Feichtinger, Graz (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 15/508,224

(22) PCT Filed: Aug. 31, 2015

(86) PCT No.: PCT/EP2015/069855
§ 371 (c)(1),
(2) Date: Mar. 2, 2017

(87) PCT Pub. No.: WO2016/034539
PCT Pub. Date: Mar. 10, 2016

(65) Prior Publication Data
US 2017/0290164 A1    Oct. 5, 2017

(30) Foreign Application Priority Data

Sep. 3, 2014   (DE) .......................... 10 2014 112 678

(51) Int. Cl.
*H05K 1/14*    (2006.01)
*H05K 3/12*    (2006.01)
(Continued)

(52) U.S. Cl.
CPC ............. *H05K 1/185* (2013.01); *H01C 1/028* (2013.01); *H01C 1/14* (2013.01); *H01C 1/148* (2013.01);
(Continued)

(58) Field of Classification Search
CPC ............. H05K 3/12; H05K 1/14; H05K 1/185
See application file for complete search history.

(56) References Cited

U.S. PATENT DOCUMENTS

| | | |
|---|---|---|
| 2003/0064873 A1 | 4/2003 | Noda et al. |
| 2010/0212122 A1 | 8/2010 | Elhaj |

(Continued)

FOREIGN PATENT DOCUMENTS

| | | |
|---|---|---|
| DE | 102011056515 A1 | 6/2013 |
| EP | 1 137 332 A1 | 9/2001 |

(Continued)

OTHER PUBLICATIONS

AT&S, Mark Beesley, *3D Component Packaging in Organic Substrate*, Mark Beesley, GSF 2012, Shanghai (26 pgs.).

(Continued)

*Primary Examiner* — Jeremy C Norris
(74) *Attorney, Agent, or Firm* — DLA Piper LLP (US)

(57) ABSTRACT

An electrical component for embedding into a carrier comprises a ceramic main body, an electrically insulating passivation layer which is applied to the main body, and at least one inner electrode. In addition, the electrical component comprises an outer electrode which is connected to the inner electrode, wherein the outer electrode comprises a first electrode layer comprising a metal and a second electrode layer which is arranged on the latter and comprises copper.

19 Claims, 1 Drawing Sheet

(51) Int. Cl.

| | |
|---|---|
| *H05K 1/18* | (2006.01) |
| *H05K 3/32* | (2006.01) |
| *H01G 4/224* | (2006.01) |
| *H01G 4/232* | (2006.01) |
| *H01C 1/028* | (2006.01) |
| *H01C 7/02* | (2006.01) |
| *H01C 7/10* | (2006.01) |
| *H01C 1/148* | (2006.01) |
| *H01C 7/18* | (2006.01) |
| *H01C 7/04* | (2006.01) |
| *H01G 4/30* | (2006.01) |
| *H01C 1/14* | (2006.01) |
| *H01C 7/00* | (2006.01) |
| *H01C 17/00* | (2006.01) |
| *H01G 4/005* | (2006.01) |
| *H01G 4/12* | (2006.01) |
| *H01G 4/248* | (2006.01) |
| *H05K 1/09* | (2006.01) |
| *H05K 1/11* | (2006.01) |
| *H01C 7/112* | (2006.01) |
| *H05K 1/03* | (2006.01) |

(52) U.S. Cl.
CPC ............ *H01C 7/008* (2013.01); *H01C 7/021* (2013.01); *H01C 7/041* (2013.01); *H01C 7/10* (2013.01); *H01C 7/1006* (2013.01); *H01C 7/18* (2013.01); *H01C 17/00* (2013.01); *H01G 4/005* (2013.01); *H01G 4/12* (2013.01); *H01G 4/224* (2013.01); *H01G 4/232* (2013.01); *H01G 4/2325* (2013.01); *H01G 4/248* (2013.01); *H01G 4/30* (2013.01); *H05K 1/09* (2013.01); *H05K 1/115* (2013.01); *H05K 3/12* (2013.01); *H05K 3/32* (2013.01); *H01C 7/112* (2013.01); *H05K 1/036* (2013.01); *H05K 2201/0195* (2013.01); *H05K 2201/10015* (2013.01); *H05K 2201/10022* (2013.01); *H05K 2201/10219* (2013.01); *H05K 2201/10636* (2013.01); *H05K 2203/063* (2013.01); *H05K 2203/0723* (2013.01)

(56) References Cited

U.S. PATENT DOCUMENTS

| | | |
|---|---|---|
| 2010/0212152 A1 | 8/2010 | Elhaj |
| 2011/0157768 A1* | 6/2011 | Hur ................. H01G 4/005 361/321.2 |
| 2012/0019099 A1 | 1/2012 | Sato et al. |
| 2014/0174800 A1 | 6/2014 | Chang et al. |
| 2015/0021077 A1* | 1/2015 | Chae ................. H01G 4/30 174/260 |

FOREIGN PATENT DOCUMENTS

| | | |
|---|---|---|
| JP | H04267320 | 9/1992 |
| JP | 2002-043105 A | 2/2002 |
| JP | 2002-100875 A | 4/2002 |
| JP | 2008-270750 A | 11/2008 |
| JP | 2010-80703 A | 4/2010 |
| JP | 2010-123865 | 6/2010 |
| JP | 2010245095 | 10/2010 |
| JP | 2012028458 | 2/2012 |
| JP | 5559717 | 8/2012 |
| JP | 2014110424 | 6/2014 |
| WO | WO2006/043474 | 4/2006 |
| WO | WO 2013/087243 A1 | 6/2013 |

OTHER PUBLICATIONS

JP Patent Application No. 2017-512344—Brief English Translation of Office Action (2 pgs.).

* cited by examiner

ELECTRICAL COMPONENT, COMPONENT ARRANGEMENT, AND A METHOD FOR PRODUCING AN ELECTRICAL COMPONENT AND COMPONENT ARRANGEMENT

RELATED APPLICATIONS/PRIORITY CLAIMS

This application is a 371 U.S. national stage filing of (and claims the benefit and priority to under 35 U.S.C. 119, 120) to PCT/EP2015/069855, filed on Aug. 31, 2015, that in turn claims priority under 35 USC 119 and 120 to DE Application No. 102014112678.5 dated Sep. 3, 2014, the entirety of all of which are incorporated herein by reference.

FIELD OF THE DISCLOSURE

Electrical component, component arrangement, and a method for producing an electrical component and component arrangement

SUMMARY

An electrical component comprising a ceramic main body is specified. The electrical component is designed for embedding into a carrier, in particular a printed circuit board. Furthermore, a component arrangement comprising a carrier and a component embedded therein is specified.

It is an object of the present invention to specify an electrical component which is suitable for embedding into a carrier.

According to a first aspect of the present invention, what is specified is an electrical component for embedding into a carrier. In particular, the carrier is a printed circuit board. The electrical component comprises a ceramic main body, to which an electrically insulating passivation layer is applied. At least one inner electrode is arranged in the main body. The inner electrode leads in particular out of the main body and through the passivation layer.

At least one outer electrode is arranged on the passivation layer and is connected to the inner electrode. The outer electrode comprises a first electrode layer and a second electrode layer applied thereto. The second electrode layer comprises copper. The second electrode layer is preferably arranged directly on the first electrode layer.

Such a combination of a passivation layer with a first electrode layer and a copper layer applied thereto ensures reliable protection of the main body against chemical and mechanical influences. By way of example, the main body is protected from moisture and process media, which can be present when embedding into a carrier, in particular in a lamination process. In addition, reliable contacting of the inner electrodes is made possible, for example by copper-containing through-connections through the carrier.

By way of example, the passivation layer comprises glass. Alternatively, the passivation layer can comprise a ceramic, for example. By way of example, the passivation layer is a burnt-in layer.

In one embodiment, the first electrode layer comprises a burnt-in paste. The first electrode layer comprises silver or silver-palladium, for example. An electrode layer of this type ensures particularly reliable contacting of the inner electrodes, in particular of inner electrodes containing silver or silver-palladium.

In one embodiment, the second electrode layer is applied in a galvanic or electrochemical method. In this case, a metal is deposited from a solution on the first electrode layer. In the case of a galvanic method, an external power source is connected for this purpose. By way of example, the first electrode layer acts as cathode. In the case of an electrochemical method, the metal is deposited currentlessly.

The second electrode layer may be designed for connection to a further contact-connection composed of copper.

The second electrode layer may be the outermost layer of the outer electrode. Accordingly, the second outer electrode may be free of a protective layer arranged above the second electrode layer.

According to a further aspect of the present invention, what is specified is a component arrangement. The component arrangement comprises the above-described electrical component. Furthermore, the component arrangement comprises a carrier, in particular in the form of a printed circuit board, into which the component is embedded. The component may be partially or completely embedded in the carrier. By way of example, the component is surrounded on all sides by the material of the carrier.

By way of example, the carrier comprises a plurality of layers arranged one on top of another. The component is, for example, embedded into at least one of the layers. By way of example, the carrier is produced in a lamination process. In one embodiment, the layers are in the form of polymer layers. The layers may comprise epoxy resin.

In one embodiment, the carrier comprises at least one through-connection for electrically contacting the component. The through-connection leads in particular at least through one layer of the carrier.

In one embodiment, the through-connection contains copper. This allows for a particularly reliable electrical contact with the component, in particular since the second electrode layer likewise contains copper. In addition, copper has a particularly good thermal conductivity. The through-connection may be produced in a galvanic method or in an electrochemical method.

In one embodiment, the component arrangement comprises at least one connection contact arranged on an outer side of the carrier. The connection contact is connected to the through-connection. In one embodiment, the connection contact contains copper. It is preferable that the connection contact, the through-connection and the second electrode layer comprise the same material, in particular copper. This allows for a particularly reliable electrical and thermal connection.

According to a further aspect of the present invention, what is specified is a method for producing an electrical component, in particular the above-described component. In this method, a ceramic main body comprising inner electrodes is provided. The main body is surrounded by an electrically insulating passivation layer. A first electrode layer is applied to the passivation layer. Then, a second, copper-containing electrode layer is applied to the first electrode layer by means of a galvanic or electrochemical method.

The invention furthermore specifies a method for producing a component arrangement, in particular the above-described component arrangement. In this method, an electrical component is produced by the above-described method. Provision is made of layers for forming a carrier, wherein at least one layer comprises a cutout. The layers are arranged one on top of another, wherein the component is arranged in the cutout. Then, the layers are pressed together so as to form a laminate.

A through-connection is produced, for example, by introducing a hole into at least one layer. By way of example, the hole is introduced into the laminate. This can be effected by means of a laser. Then, the hole is filled with an electrically conductive material.

The second electrode layer may be the outermost layer of an outer electrode.

In the present disclosure, a plurality of aspects of an invention are described. All of the properties which are disclosed with respect to the component, the component arrangement or the methods are also disclosed correspondingly with respect to the respective other aspects, and vice versa, even if the respective property is not mentioned explicitly in the context of the respective aspect.

BRIEF DESCRIPTIONS OF THE DRAWINGS

Hereinbelow, the subjects described here will be explained in more detail with reference to schematic exemplary embodiments which are not true to scale.

DETAILED DESCRIPTION OF ONE OR MORE EMBODIMENTS

It is preferable that identical reference signs in the figures which follow refer to functionally or structurally corresponding parts of the various embodiments.

Figure 1:
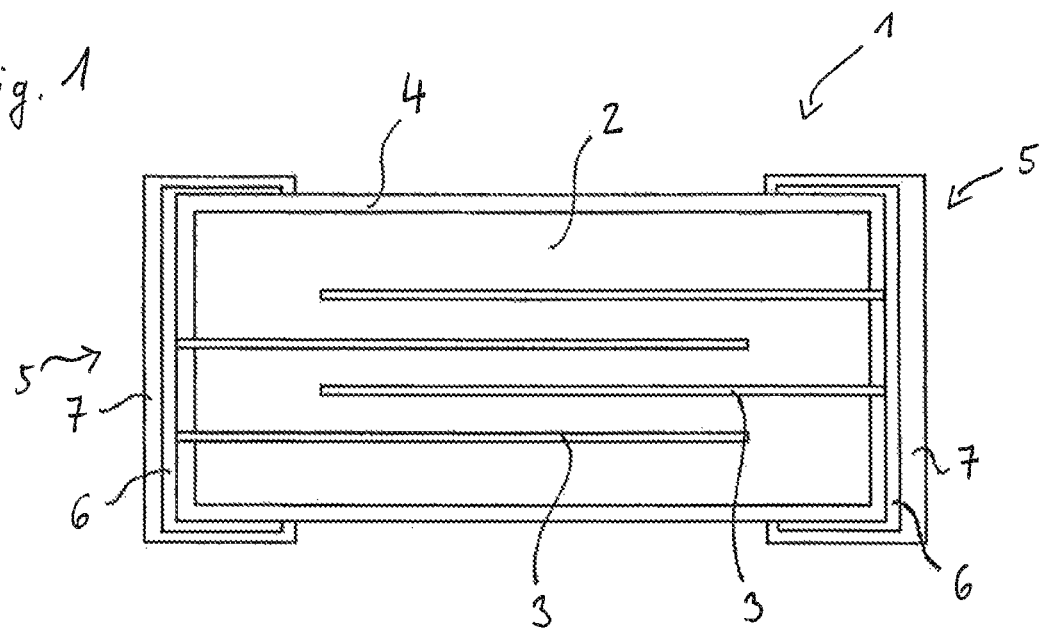
FIG. 1 shows, in a schematic sectional view, a section of a ceramic component.

FIG. 1 shows an electrical component 1 in a schematic sectional view. The electrical component 1 comprises a main body 2, which has a cuboidal configuration and comprises a ceramic material. As an alternative thereto, other structural shapes are also possible. In the exemplary embodiment shown, the ceramic material is a varistor ceramic, in particular a ZnO—Bi ceramic. Alternatively, the ceramic material may also be an NTC or PTC ceramic, in particular a thermistor ceramic or a dielectric capacitor ceramic, depending on whether the electrical component 1 is designed as a varistor, as a thermistor or as a capacitor.

The electrical component 1 furthermore comprises inner electrodes 3 containing, for example, silver-palladium. Alternatively, the inner electrodes 3 may also comprise or consist of other metals, such as for example nickel and/or copper. The inner electrodes 3 are arranged in the ceramic of the main body 2 and lead out of the main body 2. By way of example, the electrical component 1 is a ceramic multilayer component, in which the inner electrodes 3 are printed onto various ceramic layers and sintered therewith.

Furthermore, the electrical component 1 comprises an electrically insulating passivation layer 4. By way of example, the passivation layer contains glass or a ceramic material. It is preferable that the ceramic material differs from the ceramic material of the main body 2. The electrically insulating passivation layer 4 is preferably applied directly to the main body 2. The passivation layer 4 advantageously protects the electrical component 1 against mechanical and/or chemical influences, which are present, for example, during the introduction of the component 1 into a carrier.

The inner electrodes 3 lead through the passivation layer 4. The passivation layer 4 surrounds the ceramic of the main body 2 completely, for example, apart from at those locations at which the inner electrodes 3 are led through.

Outer electrodes 5 are arranged on the passivation layer 4. The outer electrodes 5 are arranged on two opposing sides of the main body 2 and are each guided via the side edges onto the adjoining sides of the main body 2. The outer electrodes 5 each comprise a first electrode layer 6 and a second electrode layer 7 arranged thereon.

The first electrode layer 6 is formed from a burnt-in metal paste. By way of example, the first electrode layer 6 comprises silver. According to a further exemplary embodiment, the electrode layer 6 may also comprise other metals, for example copper.

The second electrode layer 7 is applied by the deposition of a metal from a solution. The metal contains or is, for example, copper. A galvanic method is used, for example, for depositing the metal. In another embodiment, the metal is deposited electrolessly, in particular chemically.

The second electrode layer 7 is compatible with a further contact-connection composed of copper. In particular, the electrical component 1 is designed for embedding into the laminate of a printed circuit board. By means of the passivation layer 4, the main body 2 is also protected inter alia from a chemical copper solution, which is used for producing the second electrode layer 7.

Figure 2:
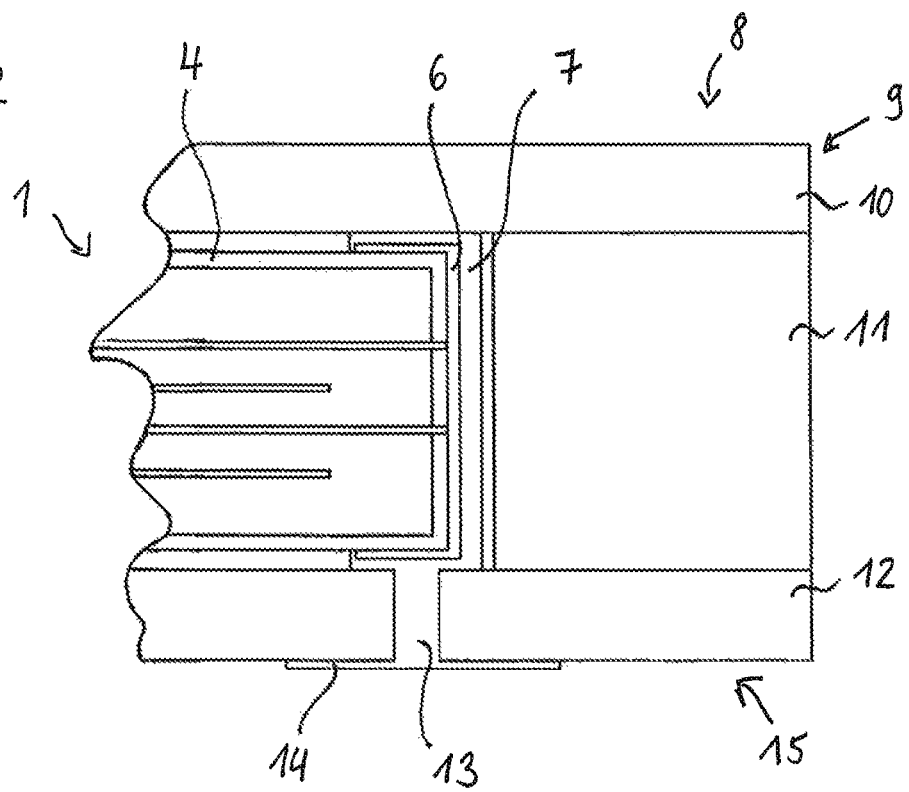
FIG. 2 shows a component arrangement comprising the component shown in FIG. 1 and a carrier.

FIG. 2 shows a section of a component arrangement 8 in a cross section. The component arrangement 8 comprises the ceramic component 1 as shown in FIG. 1. In addition, the component arrangement 8 comprises a carrier 9, into which the component 1 is embedded. The carrier 9 is in the form of a printed circuit board. The carrier 9 comprises a plurality of layers 10, 11, 12 arranged one on top of another. The layers 10, 11, 12 are in the form of polymer layers.

By way of example, the component 1 is arranged entirely within the carrier 9. In particular, at least one layer 10, 12 of the carrier 9 is present respectively above and below the component 1. It is preferable that the component 1 is surrounded on all sides by the polymer material of the carrier 9. The component 1 may be embedded into a plurality of polymer layers 11 arranged, for example, between a topmost and a bottommost polymer layer 10, 12.

An embedding of this type allows for a particularly space-saving arrangement of an electrical component 1 in a printed circuit board. In addition, alongside its function as a printed circuit board, the carrier 9 also ensures protection of the component 1 against chemical and/or mechanical influences. Moreover, the polymer material may provide temperature compensation in the case of excessive temperatures.

For the further contacting of the outer electrodes 5, provision is made in each case of a through-connection 13, which leads through at least one layer 12 of the carrier 9 to an outer side 15 of the carrier 9. The through-connection 13 contains copper. By way of example, the through-connection 13 is produced in a galvanic method.

The through-connection 13 is connected to a connection contact 14 arranged on the outer side 15, for example the bottom side of the carrier 9. The connection contact 14 is in the form of a contact pad, for example. By way of example, the connection contact 14 comprises copper. By way of example, the connection contact 14 is produced by deposition of a metal from a solution, in particular by a galvanic method.

The other outer electrode can be connected analogously to a connection contact (not depicted).

The invention claimed is:

1. An electrical component for embedding in a carrier, comprising a ceramic main body, an electrically insulating passivation layer which is applied to the main body, at least one inner electrode, and an outer electrode which is connected to the inner electrode, wherein the outer electrode comprises a first electrode layer comprising a metal and a second electrode layer which is arranged on the latter and comprises copper.

2. The electrical component according to claim 1, wherein the second electrode layer is applied in one of a galvanic method and an electrochemical method.

3. The electrical component according to claim 1, wherein the second electrode layer is designed to be connected to a through-connection being formed in one of a galvanic method and an electrochemical method.

4. The electrical component according to claim 1, wherein the first electrode layer comprises a burnt-in paste.

5. The electrical component according to claim 1, wherein the second electrode layer is arranged directly on the first electrode layer.

6. The electrical component according to claim 1, wherein the passivation layer comprises glass or a ceramic material.

7. The electrical component according to claim 1, wherein the first electrode layer contains silver.

8. The electrical component according to claim 1, wherein the second electrode layer is designed for connection to a further contact-connection composed of copper.

9. The electrical component according to claim 1, wherein the second electrode layer is an outermost layer of the outer electrode.

10. A component arrangement, comprising:
an electrical component for embedding in a carrier, comprising a ceramic main body, an electrically insulating passivation layer which is applied to the main body, at least one inner electrode, and an outer electrode which is connected to the inner electrode, wherein the outer electrode comprises a first electrode layer comprising a metal and a second electrode layer which is arranged on the latter and comprises copper; and
a carrier into which the electrical component is embedded.

11. The component arrangement according to claim 10, wherein the carrier comprises a plurality of polymer layers arranged one on top of another.

12. The component arrangement according to claim 10 further comprising at least one through-connection for electrically contacting the electrical component, wherein the through-connection passes through the carrier.

13. The component arrangement according to claim 12, wherein the through-connection contains copper.

14. The component arrangement according to claim 12 further comprising at least one connection contact arranged on an outer side of the carrier, wherein the connection contact is connected to the through-connection.

15. The component arrangement according to claim 14, wherein the at least one connection contact, the through-connection and the second electrode layer comprise the same material.

16. A method for producing an electrical component, said method comprising:
providing a ceramic main body comprising inner electrodes, which is surrounded by an electrically insulating passivation layer,
applying a first electrode layer to the passivation layer,
applying a second, copper-containing electrode layer to the first electrode layer by means of one of a galvanic method and an electrochemical method.

17. The method of claim 16 further comprising providing layers for forming a carrier, wherein at least one layer comprises a cutout, arranging the layers one on top of another and in the process arranging the component in the cutout, and pressing the layers together.

18. The method according to claim 17 further comprising introducing at least one hole into at least one of the layers and filling the hole with copper to form a through-connection.

19. The method according to claim 16, wherein the second electrode layer is the outermost layer of an outer electrode.

* * * * *